US008995675B2

(12) United States Patent
Chandak et al.

(10) Patent No.: US 8,995,675 B2
(45) Date of Patent: Mar. 31, 2015

(54) METHODS AND SYSTEMS FOR DIRECT-TO-INDIRECT ACOUSTIC RADIANCE TRANSFER

(75) Inventors: Anish Chandak, Carrboro, NC (US); Lakulish Shailesh Antani, Chapel Hill, NC (US); Micah Taylor, Pittsboro, NC (US); Dinesh Manocha, Chapel Hill, NC (US)

(73) Assignee: The University of North Carolina at Chapel Hill, Chapel Hill, NC (US)

( * ) Notice: Subject to any disclaimer, the term of this patent is extended or adjusted under 35 U.S.C. 154(b) by 723 days.

(21) Appl. No.: 13/373,940

(22) Filed: Dec. 5, 2011

(65) Prior Publication Data

US 2012/0269355 A1    Oct. 25, 2012

Related U.S. Application Data

(60) Provisional application No. 61/419,783, filed on Dec. 3, 2010.

(51) Int. Cl.
*H03G 3/00* (2006.01)
*H04R 29/00* (2006.01)
*H04S 7/00* (2006.01)
*G06F 17/50* (2006.01)

(52) U.S. Cl.
CPC *H04R 29/00* (2013.01); *H04S 7/30* (2013.01); *G06F 17/5004* (2013.01); *G06F 17/5009* (2013.01); *H04S 2400/11* (2013.01); *A63F 2300/6081* (2013.01)
USPC .............................................. 381/63; 381/61

(58) Field of Classification Search
USPC ........................ 381/61, 63, 74, 307, 309, 310
See application file for complete search history.

(56) References Cited

U.S. PATENT DOCUMENTS

| 5,142,586 A * | 8/1992 | Berkhout | 381/63 |
| 8,045,718 B2 * | 10/2011 | Faure et al. | 381/17 |
| 2008/0273708 A1* | 11/2008 | Sandgren et al. | 381/63 |

OTHER PUBLICATIONS

Brebbia et al., "Chapter 2: Computational Formulation," found in Boundary Element methods in acoustics, Computational Mechanics Publications and Elsevier Applied Science, Ciskowski et al. Eds, pp. 13-60 (1991).
Chandak et al., "Fastv: From-point visibility culling on complex models," Computer Graphics Forum, vol. 28, pp. 1237-1246(10) (2009).
Chandak et al., "Ad-frustum: Adaptive frustum tracing for interactive sound propagation," IEEE Transactions on Visualization and Computer Graphics, vol. 14, No. 6, pp. 1707-1722 (2008).

(Continued)

*Primary Examiner* — Vivian Chin
*Assistant Examiner* — Friedrich W Fahnert
(74) *Attorney, Agent, or Firm* — Jenkins, Wilson, Taylor & Hunt, P.A.

(57) ABSTRACT

Methods, systems, and computer program products for simulating propagation of sound in a static scene can be operated for pre-computing a transfer operator for simulating results of sound reflection within a modeled scene, simulating distribution of sound energy from a sound source positioned within the scene, applying the transfer operator to the distribution of sound energy from the sound source to compute simulated sound at a plurality of points within the scene, and simulating collection of sound energy from the plurality of points within the scene to a listener positioned within the scene.

21 Claims, 5 Drawing Sheets

(56) References Cited

OTHER PUBLICATIONS

Dalenback et al., "A macroscopic view of diffuse reflection," J. Audio Eng. Soc., vol. 42, pp. 793-807 (1994).

Funkhouser et al., "Survey of methods for modeling sound propagation in interactive virtual environment systems," Presence (2003).

Funkhouser et al., "A beam tracing approach to acoustic modeling for interactive virtual environments," in Proc. of ACM SIGGRAPH, pp. 21-32 (1998).

Goral et al., "Modeling the interaction of light between diffuse surfaces," SIGGRAPH Comput. Graph., vol. 18, No. 3, pp. 213-222 (Jul. 1984).

Hasan et al., "Direct-to-indirect transfer for cinematic relighting," in SIGGRAPH '06: ACM SIGGRAPH 2006 Papers. New York, NY, USA: ACM, pp. 1089-1097 (2006).

Ihlenburg, "Finite Element Analysis of Acoustic Scattering." Springer Verlag AG (1998).

Kajiya, "The rendering equation," in SIGGRAPH '86: Proceedings of the 13th annual conference on Computer graphics and interactive techniques, New York, NY, USA: ACM, pp. 143-150 (1986).

Kapralos et al., "Sonel mapping: acoustic modeling utilizing an acoustic version of photon mapping," in In IEEE International Workshop on Haptics Audio Visual Environments and their Applications (HAVE 2004), pp. 2-3 (2004).

Kontkanen et al., "Wavelet radiance transport for interactive indirect lighting," in Rendering Techniques 2006 (Eurographics Symposium on Rendering), W. Heidrich and T. Akenine- Moller, Eds. Eurographics (Jun. 2006).

Kristensen et al., "Precomputed local radiance transfer for real-time lighting design," in SIGGRAPH '05: ACM SIGGRAPH 2005 Papers. New York, NY, USA: ACM, pp. 1208-1215 (2005).

Kuttruff, "Auralization of Impulse Responses Modeled on the Basis of Ray-Tracing Results," Journal of the Audio Engineering Society, vol. 41, No. 11, pp. 876-880 (Nov. 1993).

Kuttruff, "Room Acoustics, Chapter VII: The Subjective Effects of Combined Sound Fields" Elsevier Science Publishing Ltd., pp. 171-217 (1991).

Kuttruff, "Room Acoustics, Chapter VIII: Measuring Techniques in Room Acoustics" Elsevier Science Publishing Ltd., pp. 218-256 (1991).

Kuttruff, "Room Acoustics, Chapter IX: Design Considerations and Design Procedures" Elsevier Science Publishing Ltd., pp. 257-288 (1991).

Lehtinen et al., "A meshless hierarchical representation for light transport," in SIGGRAPH '08: ACM SIGGRAPH 2008 papers. New York, NY, USA: ACM, pp. 1-9 (2008).

Levy et al., "Least squares conformal maps for automatic texture atlas generation," ACM Trans. Graph., vol. 21, No. 3, pp. 362-371 (2002).

Oppenheim et al., "Discrete-Time Signal Processing," 2nd ed. Prentice Hall, Section 7.2, pp. 465-478 (Jan. 1999).

Raghuvanshi et al., "Precomputed wave simulation for real-time sound propagation of dynamic sources in complex scenes," in Proc. SIGGRAPH 2010 (2010).

Raghuvanshi et al., "Accelerated wave-based acoustics simulation," in SPM '08: Proceedings of the 2008 ACM symposium on Solid and physical modeling. New York, NY, USA: ACM, pp. 91-102 (2008).

Schroder et al., "Real-time hybrid simulation method including edge diffraction," in EAA Auralization Symposium (2009).

Siltanen et al., "Frequency domain acoustic radiance transfer for real-time auralization," Acta Acustica united with Acustica, vol. 95, pp. 106-117(12) (2009).

Siltanen et al., "The room acoustic rendering equation." The Journal of the Acoustical Society of America, vol. 122, No. 3, pp. 1624-1635 (Sep. 2007).

Sloan et al., "Precomputed radiance transfer for real-time rendering in dynamic, low-frequency lighting environments," in SIGGRAPH '02: Proceedings of the 29th annual conference on Computer graphics and interactive techniques. New York, NY, USA: ACM, pp. 527-536 (2002).

Stavrakis et al., "Topological sound propagation with reverberation graphs," Acta Acustica/Acustica—the Journal of the European Acoustics Association (EAA) (2008).

Svensson et al., "Computational modelling and simulation of acoustic spaces," in 22nd International Conference: Virtual, Synthetic, and Entertainment Audio, pp. 11-30 (Jun. 2002).

Svensson et al., "An analytic secondary source model of edge diffraction impulse responses," Acoustical Society of America Journal, vol. 106, pp. 2331-2344 (Nov. 1999).

Taylor et al., "Fast edge-diffraction for sound propagation in complex virtual environments," in EAA Auralization Symposium (Jun. 2009).

Taylor et al., "Resound: interactive sound rendering for dynamic virtual environments," in MM '09: Proceedings of the seventeen ACM international conference on Multimedia. New York, NY, USA: ACM, pp. 271-280 (2009).

Terai, "Chapter 10: BEM Applications in Architectural Acoustics," found in Boundary Element methods in acoustics, Computational Mechanics Publications and Elsevier Applied Science, Ciskowski et al Eds, pp. 193-224 (1991).

Torres et al., "Audibility of "diffusion" in room acoustics auralization: An initial investigation," Acta Acustica united with Acustica, vol. 86, pp. 919-927(9) (Nov./Dec. 2000).

Tsai et al., "All-frequency precomputed radiance transfer using spherical radial basis functions and clustered tensor approximation," ACM Trans. Graph., vol. 25, No. 3, pp. 967-976 (2006).

Vorlander, "Simulation of the transient and steady-state sound propagation in rooms using a new combined ray-tracing/ image-source algorithm," The Journal of the Acoustical Society of America, vol. 86, No. 1, pp. 172-178 (1989).

Wang et al., "Precomputed radiance transfer for real-time indirect lighting using a spectral mesh basis," in Proceedings of the Eurographics Symposium on Rendering (2007).

* cited by examiner

METHODS AND SYSTEMS FOR DIRECT-TO-INDIRECT ACOUSTIC RADIANCE TRANSFER

PRIORITY CLAIM

This application claims the benefit of U.S. Provisional Patent Application Ser. No. 61/419,783, filed Dec. 3, 2010; the disclosure of which is incorporated herein by reference in its entirety.

GOVERNMENT INTEREST

This presently disclosed subject matter was made with U.S. Government support under Grant No. W911NF-04-1-0088 awarded by Army Research Office, Grant Nos. OCI-0636208, IIS-0917040, and 0904990 awarded by National Science Foundation, and Grant No. W91CRB-08-C-0137 awarded by U.S. Army. Thus, the U.S. Government has certain rights in the presently disclosed subject matter.

TECHNICAL FIELD

The subject matter disclosed herein relates generally to methods and systems for modeling sound propagation in a scene. More particularly, the subject matter disclosed herein relates to methods and systems for simulating diffuse reflections, specular reflections, and edge diffraction of sound in a static scene.

BACKGROUND

Sound rendering or auditory displays can augment graphical rendering and provide the user with an enhanced spatial sense of presence. Sound propagation in a scene refers to the modeling of the sound heard by the listener after the sound emitted from each source undergoes reflections, diffraction and absorption through the scene. Some of the driving applications of sound rendering include acoustic design of architectural models or outdoor scenes, walkthroughs of large CAD models with sounds of machine parts or moving people, urban scenes with traffic, and computer games, among others. The computation of sound propagation paths can take into account the knowledge of sound sources, listener locations, the 3D model of the environment, and material absorption and scattering properties.

Preferably, the modeling of sound propagation effects can further account for different wave propagation phenomena such as specular reflections, scattering (including diffuse reflections and edge diffraction), interference, and other phenomena. In particular, with respect to modeling of diffuse reflections, for instance, which are considered important for modeling sound propagation, many objective and perceptual studies have been conducted to ascertain the importance of diffuse reflections for sound propagation. Further, it is computationally challenging to model high orders of diffuse reflection. Thus, due to its importance and computational challenge, modeling diffuse reflections for sound propagation is an active area of interest in many sound rendering applications.

At a broad level, sound propagation algorithms can be classified into numerical and geometric methods. Numerical methods attempt to directly compute numerical solutions to the acoustic wave equation. The propagation of sound in a medium is governed by the acoustic wave equation, a second-order partial differential equation. Several techniques (e.g., finite difference time-domain method) are known for directly solving the wave equation using numerical methods and accurately modeling sound propagation in a scene. Modeling diffuse reflections is essentially a matter of specifying appropriate boundary conditions to the numerical solver and performing the simulation on a grid fine enough to capture the detailed "roughness" of the surfaces that results in acoustic wave scattering. However, despite recent advances, these methods can be rather slow and are mainly limited to simple static sources, at least the in part because the complexity of these methods is proportional to the volume of the scene and the fourth power of the maximum frequency of sound simulated, and thus can be very slow for large acoustic spaces or high frequency sound sources.

To address these issues, precomputation-based methods have been developed that use a numerical simulator to compute the acoustic response of a scene from several sampled source positions such that, at runtime, these responses are interpolated given the actual source position. These methods are faster, but require large amounts of precomputed data.

In terms of geometric sound propagation, two standard methods used to simulate diffuse sound reflections are based on ray (or volume) tracing and radiance transfer. Most sound propagation techniques used in practical applications model the acoustic effects of an environment in terms of linearly propagating rays or 3D volumes. These geometric acoustics techniques are not as accurate as numerical methods in terms of solving the wave equation, and cannot easily model all kinds of propagation effects, but allow efficient simulation of early reflections. For instance, methods based on ray tracing are able to model both diffuse and specular reflections of sound. Since early specular reflections provide the listener with important perceptual cues regarding the direction of sound, specialized techniques have been developed for modeling specular reflections, which include volume tracing and the image source method. For static scenes, which frequently arise in architectural acoustics and virtual environments, radiance transfer methods can be used to simulate reflections from surfaces with arbitrary bidirectional reflectance distribution functions (BRDFs). Many techniques have also been designed to simulate edge diffraction.

Accordingly, conventional numerical and geometric methods each have significant disadvantages that limit their abilities to effectively simulate diffuse reflections (or specular reflections, edge diffraction, etc.) of sound in real time.

SUMMARY

It is an object of the presently disclosed subject matter to provide methods and systems for simulating propagation of sound in a modeled scene. In one aspect, for example, the present subject matter provides a method for simulating sound propagation within a scene. The method can comprise pre-computing a transfer operator for simulating results of sound reflection within a modeled scene, simulating distribution of sound energy from a sound source positioned within the scene, applying the transfer operator to the distribution of sound energy from the sound source to compute simulated sound at a plurality of points within the scene, and simulating collection of sound energy from the plurality of points within the scene to a listener positioned within the scene.

In another aspect, the present subject matter provides computer readable medium having stored thereon executable instructions that when executed by the processor of a computer control the computer to perform steps of pre-computing a transfer operator for simulating results of sound reflection within a modeled scene, simulating distribution of sound energy from a sound source positioned within the scene, applying the transfer operator to the distribution of sound energy from the sound source to compute simulated sound at a plurality of points within the scene, and simulating collection of sound energy from the plurality of points within the scene to a listener positioned within the scene.

In a further aspect, the present subject matter provides a system for simulating sound propagation within a scene. The system can comprise a transfer operator embodied in a computer readable medium for simulating results of sound reflection within a scene and a sound simulator for receiving as input a distribution of sound energy from a sound source positioned within a scene and for applying the transfer operator to the distribution of sound energy from the sound source to compute simulated sound at a plurality of points within the scene.

An object of the presently disclosed subject matter having been stated hereinabove, and which is achieved in whole or in part by the presently disclosed subject matter, other objects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

Figure 1:
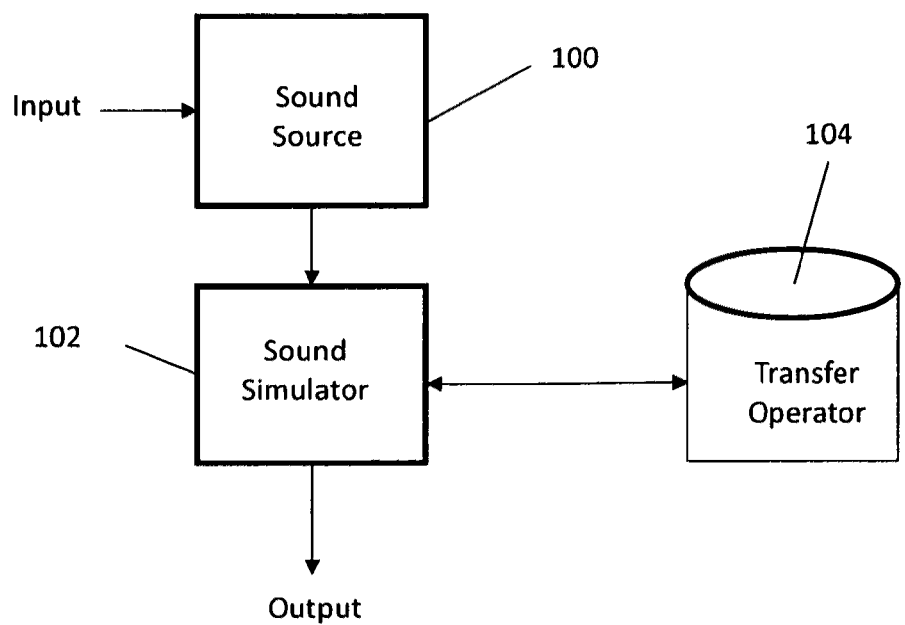
FIG. 1 is a block diagram illustrating an exemplary system for simulating sound propagation within the scene according to an embodiment of the presently disclosed subject matter.

The methods and systems according to the present subject matter apply developments in global illumination based on precomputed light transport algorithms to the simulation of sound propagation. Specifically, the present methods and systems simulate propagation of sound using techniques derived from direct-to-indirect transfer algorithms for visual rendering, which map direct light incident on the surfaces of a scene to indirect light on the surfaces of the scene after multiple bounces. The radiosity algorithm is the classic example of an algorithm which precomputes light transport effects in a scene. However, the classic radiosity algorithm uses a full solution that needs to be recomputed every time the light source moves.

In contrast, precomputed radiance transfer (PRT) algorithms essentially decouple light transport effects from the light source configuration. This is performed by computing a linear operator that defines how a variable light source configuration affects the radiances at sample points on the surfaces in the scene. PRT techniques can support both distant and local source configurations.

Direct-to-indirect transfer algorithms are one class of precomputed light transport algorithms. These algorithms compute linear operators which map direct light incident on the surface samples to multi-bounce indirect light at the samples. These algorithms are designed to handle diffuse reflections, and some of them can also support limited glossy reflections. In order to reduce the storage and processing requirements, these techniques project the radiance function over the surface of the scene into a hierarchical basis, such as Haar wavelets or the spectral mesh basis.

The methods and system according to the presently-disclosed subject matter applies these ideas to sound propagation. In particular, the disclosed subject matter provides an algorithm for modeling propagation of sound based on the direct-to-indirect transfer approach. This formulation decouples the precomputation of acoustic radiance transfer operators from both the source and the listener positions and can efficiently update the acoustic response at the listener whenever the source moves.

The algorithm uses an SVD approximation of the transfer operator to perform higher-order reflections and/or refractions. This approximation allows a user to reduce the memory requirements and increase the performance of the algorithm. The algorithm decouples the transfer operator from the source position, and thus accelerates the computations as compared to conventional methods for modeling the propagation of sound. In fact, application of this method can perform diffuse reflections, specular reflections, and edge diffraction in static scenes with moving sources at almost interactive rates.

As discussed hereinbelow, methods and systems according to the present subject matter provide a direct-to-indirect acoustic radiance transfer technique to accelerate the radiance transfer computations for sound propagation so that the first few orders of reflection and/or refraction can be computed efficiently, for static scenes with moving sources.

FIG. 1 is a block diagram illustrating an exemplary system for simulating sound propagation within the scene. Referring to FIG. 1, a sound source 100 generates sounds in response to user input. Sound source 100 may be any suitable application that generates simulated sounds, such as a computer game. Sound simulator 102 uses a pre-computed transfer operator 104 to generate the simulated sound output at different points in the scene, even when the sound source is moving. Sound simulator 102 may use a simple matrix multiplication operation for plural source positions to compute simulated sound at plural points in the scene. As a result, the computation of the impulse response at different points in the scene is reduced.

In one embodiment of the subject matter described herein, sound simulator 102 and transfer matrix 104 may be implemented as middle-ware between an application, such as a game or acoustic modeling software, and the underlying sound generation hardware.

Sound Rendering vs. Visual Rendering

There are some key differences between the nature of light and sound waves. With light transport simulation, the primary concerns involve the steady-state values of radiance over the surface of the scene. This is because light travels fast enough that transient radiance values are not observed and can be ignored. However, the speed of sound in air is much slower (i.e., 340 m/s for sound as compared to $3 \times 10^8$ m/s for light), and hence it is important to compute time-varying radiances over the surface. It is this time variation which gives rise to echoes and reverberation in large rooms. The additional dimension of time makes it difficult to apply light transport algorithms directly to model sound propagation.

Another key difference between light and sound is that the wavelengths of sound waves are much larger than the wavelengths of light waves, and are comparable to the sizes of obstacles in typical architectural and game scenes. Therefore, diffraction plays an important role in sound propagation, and it must be modeled in order to generate plausible sounds. As discussed below, the present methods and system are described with respect to modeling diffuse reflections. Those having ordinary skill in the art will recognize, however, that the principles discussed herein can be combined with other algorithms for computing specular reflection, edge diffraction, etc.

The basic sound propagation problem is that for a given signal emitted by a source (i.e., a time-varying pressure wave), the signal heard by a listener after modeling the reflections, diffractions, and interferences with the environment must be computed. This is typically performed using impulse responses (IRs). An IR describes the sound heard at the listener if the source emits a unit impulse at t=0. Under the assumptions of room acoustics, the sound heard by the listener for an arbitrary source sound can be computed by convolving the source sound with the IR at the listener's location. Therefore, the remainder of the discussion below will focus on computing IRs given the source and listener positions and a geometric model of the scene along with the material properties.

Method

Figure 2:
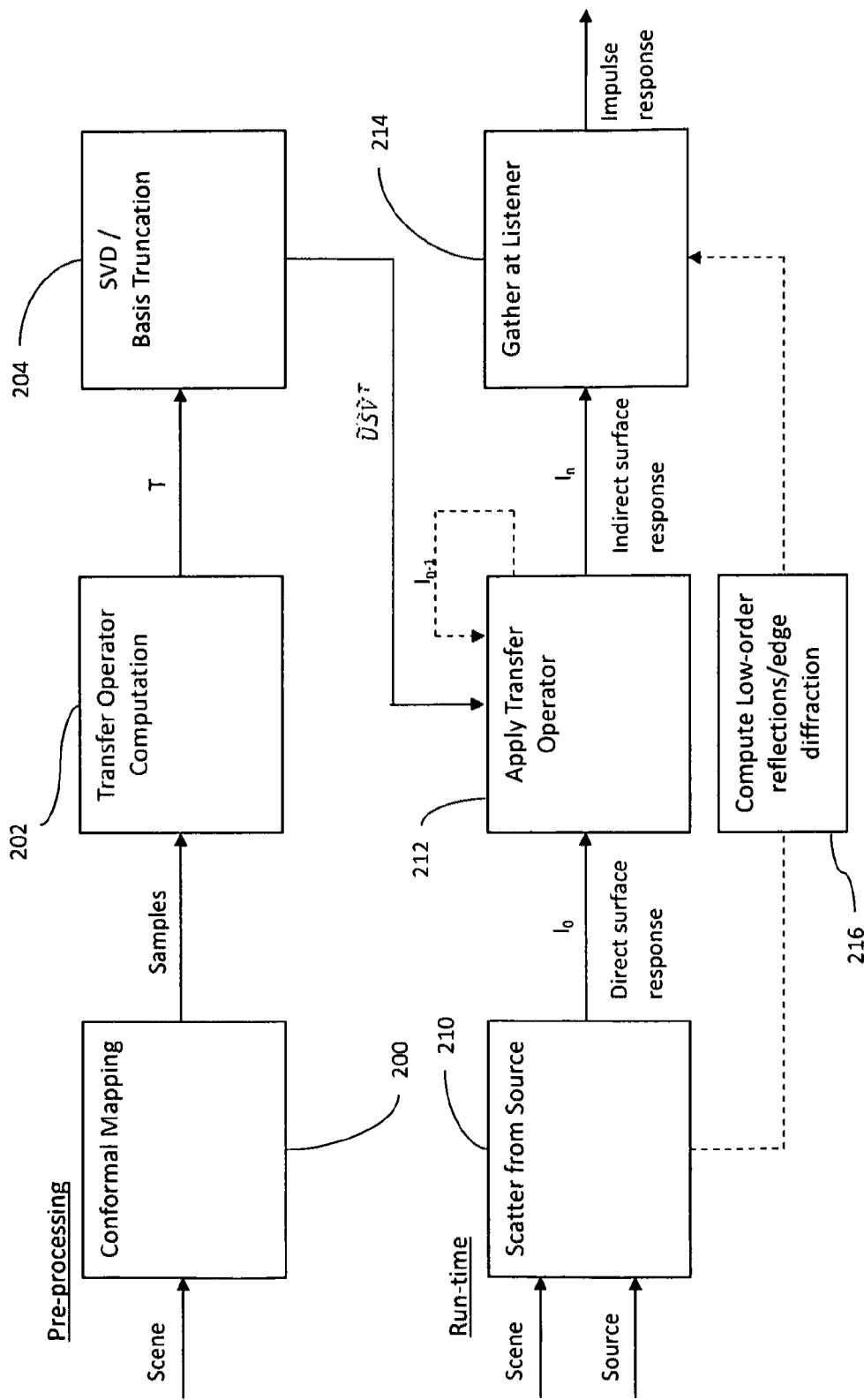
FIG. 2 is a block diagram illustrating an exemplary method for simulating sound propagation within the scene according to an embodiment of the presently disclosed subject matter.

Methods and system according to the present subject matter can use the direct-to-indirect transfer formulation for modeling propagation of sound. FIG. 2 is a block diagram illustrating an exemplary method for simulating sound propagation within the scene. Referring to FIG. 2, the method can involve taking information about a scene and mapping the scene to a desired model (Step 200). This step can involve choosing a number of sample points on the scene surfaces. Based on this mapping, a transfer matrix T can be constructed (Step 202), from which a singular value decomposition can be developed (Step 204) as described below. Each of steps 200, 202, and 204 can be completed in pre-processing.

During run-time, information about the scene and the sound source can be collected (Step 210). Given the source position, the direct impulse response at each sample point can be computed. For example, this may be performed at runtime using ray tracing. Given the direct responses, the "indirect" response at each sample (for some user-specified number of reflections and/or refractions) can be computed (Step 212). This is expressed as a matrix-vector multiplication, where the transfer matrix is precomputed. Given the direct and indirect responses, the final IR can be computed at the listener position (Step 214). This is performed at runtime using ray tracing.

Alternatively or in addition, sound propagation from the source to the listener can be computed using a two-pass algorithm. In this algorithm, the transfer matrix can be applied to the direct surface responses to model higher-order, late response reflections and edge diffraction, whereas lower-order, early response reflections (diffuse and specular) and edge diffractions can be computed in a separate step 216. For example, this computation of the early response can be performed using path tracing. These two passes are disjoint (i.e., no path is traced in both passes), and thus the contributions from each pass can be directly added together, along with the direct source-to-listener contribution, to determine the final resulting sound output at the listener.

Note that this formulation requires that the scene be static, otherwise the transfer matrix would need to be recomputed every frame. It should be noted, however, that in many applications, including games and virtual environments, scenes are entirely or mostly static, with relatively few moving parts, and hence the present algorithm can still be used to model reflections within the static portions of the scene. It is further noted, however, that the method disclosed herein can account for dynamic objects in the scene to at least a limited extent. If ray tracing is used to compute the direct impulse response at each sample point, these rays can intersect and be blocked by dynamic objects, which allows dynamic objects to induce a "shadow" region and reduce the energy in the direct echograms at the surface samples in the shadow region. Since these (modified) direct echograms are used as input to the precomputed acoustic transfer operator, dynamic objects can thereby affect (to a limited extent) the propagated sound field heard at the listener. Similarly, since interactive ray tracing can be used in the final gather step, reflected and/or diffracted sound can be occluded by a dynamic object before it reaches the listener.

Regardless of the specific implementation of the above method, the use of a transfer operator to accelerate the radiance transfer computations for sound propagation are described hereinbelow in further detail.

Acoustic Rendering Equation

As a geometric approximation to the acoustic wave equation, the propagation of sound in a scene can be modeled using an extension of the standard graphics rendering equation, called the acoustic rendering equation:

$$L(x', \omega) = L_0(x', \omega) + \int_S R(x, x', \omega) L\left(x, \frac{x'-x}{|x'-x|}\right) dx \quad (1)$$

where L is final outgoing radiance, $L_0$ is emitted radiance and R is the reflection kernel, which describes how radiance at point x influences radiance at point x':

$$R(x,x',\omega) = \rho(x,x',\omega) G(x,x') P(x,x') \quad (2)$$

Here, $\rho$ is the BRDF of the surface at x, G is the form factor between x and x', V is the point-to-point visibility function, and P is a propagation term that takes into account the effect of propagation delays. The latter is unique to sound rendering as visual rendering algorithms neglect propagation delays due to the high speed of light.

Note that the radiances used in Equation 1 are functions of time—typically impulse responses. The time variable t is hidden in Equation 1 for the sake of brevity. This added dimension of time complicates the storage and processing requirements of sound propagation algorithms based on the acoustic rendering equation. Visual rendering algorithms typically model glossy reflections using a directionally-varying radiance function, which can be represented using spherical harmonics or some other directional basis. In order to model sound reflections using time-varying radiances, a basis such as the Fourier basis can be used, or a scene-dependent Karhunen-Loeve transform (KLT) can be used. Examples of each of these representations are disclosed hereinbelow. In addition, those having skill in the art will recognize that other signal compression techniques, such as the discrete cosine transform, modified discrete cosine transform, or wavelet representations, may be applied to model the sound reflections.

Fourier Representation of Impulse Response

The methods used to represent impulse responses in the frequency domain are intended to compute impulse responses at surface samples and the listener. The impulse response at a point is a function of time, denoted by f(t). In order to apply attenuation and delay using a unified formulation, IRs can be represented in the frequency domain using the Fourier transform. For a continuous function $f: [0,T] \to \mathbb{R}$, the Fourier transform is defined as (up to a scale factor):

$$\mathcal{F}(f(t)) = F(\omega) = \int_0^T f(t)e^{i\omega t}dt \quad (3)$$

and the inverse Fourier transform is defined as (up to a scale factor):

$$\mathcal{F}^{-1}(F(\omega)) = \hat{f}(t) = \int_{-\infty}^{\infty} F(\omega)e^{i\omega t}d\omega \quad (4)$$

Here, F is the Fourier transform of f. The inverse Fourier transform is exact (i.e., $\hat{f}(t)=f(t)$) only for periodic functions. However, the domain of f is finite, whereas the domain of F is infinite. For functions defined over a finite interval [0,T] (such as IRs), the Fourier transform implicitly assumes that f(t) is periodic with period T, and can be extrapolated over the entire real line.

One way to interpret this is that the Fourier transform is a linear transform over infinite-dimensional function space. It transforms functions from the canonical basis (where the basis vectors are Dirac delta functions of the form $\delta(t-t_i)$) to a sinusoidal basis (with basis vectors of the form $e^{i\omega_i t}$). However, this transformation involves a projection into the subspace of periodic functions. Therefore the inverse Fourier transform reconstructs a periodic function which matches the original function in the interval [0,T].

In this vector space interpretation of the Fourier transform, Equation 3 is a dot product. This suggests the way to compute the Fourier transform of a function sampled at N discrete points, or the Discrete Fourier Transform (OFT):

$$F_k = \sum_{i=0}^{N-1} f_i e^{-i\omega t}dt \quad (5)$$

and the corresponding inverse DFT:

$$f_i = \frac{1}{N}\sum_{k=0}^{N-1} F_k e^{-i\frac{2\pi}{N}ki} \quad (6)$$

Here, the $f_i$s denote samples of f(t) at equi-spaced points of time, and $F_k$s denote samples of F(w) at equi-spaced values of normalized frequency. Computing the N dot products of N-dimensional vectors in Equation 5 would take $O(n^2)$ time. Using the Fast Fourier Transform (FFT) algorithm, however, the DFT of a function with N samples can be computed in O(n log n) time by exploiting correlations between elements of the Fourier basis vectors.

The linearity property of the Fourier transform implies that attenuations and accumulation of IRs can be performed easily:

$$\mathcal{F}(af_1(t)+bf_2(t)) = a\mathcal{F}(f_1(t)) + b\mathcal{F}(f_2(t)) \quad (7)$$

Another useful implication is that unlike in time-domain, in frequency-domain delays can also be applied using a scale factor:

$$\mathcal{F}(f(t-\Delta t)) = e^{-i\omega\Delta t}\mathcal{F}(f(t)) \quad (8)$$

Note that care must be taken to ensure that the delays align on sample boundaries, otherwise the inverse Fourier transform will contain non-zero imaginary parts.

If a unit impulse emitted by the source is modeled at time t=0 (i.e., the signal emitted by the source has all Fourier coefficients set to 1), then computing the acoustic radiance transfer using the above expressions for delay and attenuation results in a frequency-domain signal. Computing the inverse Fourier transform of this signal can yield a periodic function which is approximately equal to the time-domain IR at the listener within the interval [0,T] for some user-specified maximum IR time T, which is also the period of the function. It is important to note that this method does not compute the steady-state acoustic response, but the time-varying impulse response. The key to this is the frequency-domain delay equations described above.

The Fourier transform allows IRs to be stored at all the sample points as a collection of N column vectors, one for each Fourier coefficient. This also allows for transfer operators to be stored as a collection of N matrices, and allows direct-to-indirect transfer to be expressed as N matrix-vector products.

Using the relationships discussed above, the transfer operator can be constructed. First, if the surface is discretized into p samples, the transfer operator can be computed in terms of the direct impulse responses at all samples to impulses emitted from every other sample. Since these are time-varying impulse responses, Fourier coefficients can be used to represent the signals in the frequency domain. For example, if there are f Fourier coefficients per surface sample, computations can be performed on each frequency band (each band corresponding to one Fourier coefficient) independently. From the definition of the Fourier basis functions, the Fourier coefficients have frequencies $$\omega_k = \frac{2\pi}{f}k,$$

k=0 ... $f$-1.

For each frequency $\omega_k$, acoustic radiance vectors of the form $l(\omega_k)$ can be defined, which contain p elements that represent the $k^{th}$ Fourier coefficients of the IRs at each patch. For the sake of brevity, the parameter $\omega_k$ can be omitted from the equations as it may be obvious from the context. All of the computations described below are repeated for each frequency $\omega_k$.

If the Neumann series expansion is taken of Equation 1 and expressed in matrix form, the following relationship can be established:

$$l_{n+1}(\omega_k) = T(\omega_k)l_n(\omega_k) \quad (9)$$

where $l_n(\omega_k)$ is the $k^{th}$ Fourier coefficient of the IRs at each surface sample after n reflections. The transfer matrix $T(\omega_k)$ can be used to compute the effect of one reflection (i.e., a single bounce). The $(i,j)^{th}$ element of $T(\omega_k)$ describes how the $k^{th}$ Fourier coefficient at sample j affects the $k^{th}$ Fourier coefficient at sample i after one reflection. The entries of T can be computed by shooting rays and computing visibility and form factors between samples. The propagation terms are complex numbers which are computed for each Fourier coefficient using the distances between samples [19].

The above matrix-vector multiplication can be performed once per frequency coefficient for each order of reflection at runtime. However, even for scenes of moderate complexity, the number of surface samples p can be very large. Since T is a p×p matrix and $l_n$ is a p×1 vector, this step takes $O(p^2)$ time per frequency coefficient per order of reflection, which can quickly become quite expensive. The singular value decomposition (SVD) can be used, however, to compute a rank k approximation of T. This can reduce the complexity to O(pk). In addition, this approximation can allow for further acceleration of higher-order reflections.

The SVD approximation can be used to reduce the complexity of the matrix-vector multiplications to O(pk) per bounce, however, for multiple bounces, the cost of computing transfer matrices that represent additional bounces can be further reduced to $O(k^2)$ by precomputing appropriate matrices. Suppose the direct IRs at each surface sample (for a given frequency) are stored in a vector $I_0$. Further suppose that there is a rank k approximation of T, given by $\tilde{T}=\tilde{U}\tilde{S}\tilde{V}^T$, where $\tilde{U}$ is a p×k matrix, $\tilde{S}$ is a k×k diagonal matrix and $\tilde{V}^T$ is a k×p matrix. Then the first-order impulse response at each surface sample is given by:

$$\tilde{T}l_0 = \tilde{U}\tilde{S}\tilde{V}^T l_0$$
$$= \tilde{U}b$$

where $b=\tilde{S}\tilde{V}^T I_0$ is $l_0$ projected into the span of the first k right singular vectors of T. The second-order response is:

$$\tilde{T}\tilde{T}l_0 = \tilde{U}(\tilde{S}\tilde{V}^T \tilde{U})\tilde{S}\tilde{V}^T l_0$$
$$= \tilde{U}Db$$

where $D=\tilde{S}\tilde{V}^T\tilde{U}$ is essentially the one-bounce operator in the k-dimensional subspace spanned by the singular vectors corresponding to the top k singular values of T. The cost of multiplying b by D is simply $O(k2)$. Notice that the third-order response can be written as $\tilde{U}D^2 b$, and so on. This allows for computation of higher-order responses using a k×k matrix instead of a p×p matrix. Thus the first few orders of reflection and/or refraction can be quickly computed at runtime, wherein the approximation error due to the SVD is compensated by the gain in performance.

KLT Representation of Impulse Response

Rather than representing impulse responses in the frequency domain using Fourier transforms, a scene-dependent KLT basis can be used to represent echograms, an echogram being the energy contained in an IR as a function of time that is proportional to the square of the IR. In this way, the disclosed methods and systems can be used to efficiently compute higher-order (e.g., beyond 2-3 orders), late response (LR) reflections and edge diffraction of sound, which changes in response to a moving source and a moving listener in a scene.

The acoustic transfer operator for this embodiment can be defined by writing the incident form of the acoustic rendering equation in terms of a linear operator:

$$L(x, \Omega, t) = L_0(x, \Omega, t) + \mathcal{R}L(x, \Omega, t) \qquad (10)$$
$$= \mathcal{T}L_0(x, \Omega, t)$$

where $L_0(x, \Omega, t)$ represents the direct acoustic radiance incident at surface point x, $L(x, \Omega, t)$ represents the indirect acoustic radiance incident at x after multiple reflections and diffraction through the scene, $\mathcal{R}$ is a linear operator corresponding to the reflection kernel in Equation 2 and $\mathcal{T} = (\mathcal{I} - \mathcal{R})^{-1}$ is the acoustic transfer operator.

It can be assumed that acoustic radiance at a surface sample does not vary with direction (i.e., the surface samples are diffuse emitters and receivers). In other words, the transfer operator models sound energy which is emitted uniformly in all directions from a given surface sample, and propagates through the scene (undergoing several diffuse and specular reflections as well as diffraction) until the propagation is finally terminated upon incidence at some other surface sample. The propagated, incident sound field is averaged over all incidence directions, resulting in a directionally-invariant indirect acoustic radiance at each surface sample. This simplifying assumption is motivated by the fact that after a few orders of reflection, most of the sound energy in a scene would have typically undergone diffuse reflections. This may result in some higher-order echoes being replaced with reverberation, but this replacement can be corrected when computing the early response.

Using the above relationships, a compact representation of the acoustic transfer operator can be computed. First, n points on the surface of the scene can be sampled using area-weighted sampling. A compact, scene-dependent KLT basis can then be constructed for representing echograms, which can be used to compress echograms computed between each surface sample. Energy-based path tracing (i.e., Monte Carlo integration of the acoustic rendering equation) can be used to compute the sample-to-sample echograms. When each path encounters a geometric primitive, it can be diffusely reflected, specularly reflected, or diffracted, depending on material properties. Attenuations can be applied according to standard geometric acoustics models as discussed below.

Regarding diffuse reflections, rays can be diffusely reflected as per the Lambertian model by randomly sampling a direction on the hemisphere at the point of incidence, and sending a reflected ray along the sampled direction. The ray's energy is attenuated by the frequency-dependent diffuse coefficient $d(v)=(1-\alpha(v))\sigma(v)$, where $\alpha(v)$ is the frequency-dependent absorption coefficient and $\sigma(v)$ is the frequency-dependent scattering coefficient of the surface material. Specular reflection of rays can be performed by reflecting incident rays as per the laws of reflection. The ray's energy is attenuated by the frequency-dependent specular coefficient $\sigma(v)=(1-\alpha(v))(1-\sigma(v))$. Edge diffraction can be modeled using an energy-based ray tracing model derived from Heisenberg's uncertainty principle. Rays which pass sufficiently close to a diffracting edge are diffracted by deviating them in the plane normal to the diffracting edge. The angle of deviation is randomly sampled from a frequency-dependent probability distribution.

In order to capture closely-spaced echoes, which may arise in second or third order reflections captured in the transfer operator, echograms can be sampled at the audio sampling rate of 48 kHz. As a result, it is impractical to store precomputed sample-to-sample echograms in the time domain, since this would require 192 kB per second per echogram. For n≈256 surface samples, this would result in the transfer operator requiring 12 GB of storage per second.

As compared to frequency-domain representations, such as the Fourier transform approach presented above, which can require a few thousand coefficients in order to represent the wide range of audible sound frequencies, it can be preferred to use a basis in which echograms can be represented using relatively few coefficients.

Accordingly, the present method can use a scene-dependent Karhunen-Loeve basis, derived using the Karhunen-Loeve Transform (KLT). In order to derive an orthogonal basis for a d-dimensional vector space S, some number (say p) of vectors can be randomly sampled in the space. These vectors can be written as column vectors and placed side-by-side to form the data matrix $A_{d \times p}$ (subscripts denote matrix dimensions). The singular value decomposition (SVD) can then be used to decompose the data matrix: $A_{d \times p}=U_{d \times p}\Sigma_{p \times p} V^t_{p \times p}$. The columns of the orthogonal matrix U can then be used as a basis set for S.

To generate an orthogonal basis for sample-to-sample echograms in a given scene, p pairs of surface samples can be randomly choosen, and echograms can be computed between them (using path tracing). The dimension of the vector space in which all echograms lie is equal to the number of samples used to represent the echograms in the time domain. These echograms can be used to form the data matrix, and then the SVD can be used to compute the KLT basis matrix U. Since the basis vectors are sorted in decreasing order of singular values, U can be truncated such that only the first m columns are retained. Using this method, the approximation error can be barely perceptible, even with very few basis vectors (m≈32–64).

In essence, this formulation "learns" a good basis for representing echograms in a given scene by using several example echograms computed in the scene. Assuming the surface sample pairs used to generate the example echograms are distributed throughout the scene, the Karhunen-Loeve transform can be used to estimate a basis of echograms that requires the fewest number of coefficients to represent an echogram in the scene for a given approximation error. Furthermore, since the storage and time complexity of this algorithm scales linearly with m, the Karhunen-Loeve basis can be used to represent the acoustic transfer operators compactly.

The direct echogram due to a single source at surface sample j can be completely characterized by a delayed impulse with (distance) attenuation $a^s_j$ and a delay $d^s_j$. Similarly, the response at a listener due to direct sound along each gather ray i can be completely characterized by a delayed impulse with (distance) attenuation $a^l_i$ and a delay $d^l_i$.

For simplicity, the BRDFs at the first and last reflections can be multiplied into the acoustic transfer operator. Furthermore, for simplicity of exposition, it can be assumed that the number of gather rays traced from the listener is also n. In practice, we trace O(n) gather rays, with the constant factor chosen based on run-time performance. As each gather ray hits a point on the surface of the scene, the point is mapped to a surface sample using nearest-neighbor interpolation. The surface sample corresponding to gather ray l can be denoted by S(i).

These attenuations and delays can then be combined with the compressed acoustic transfer operator to compute the final echogram. The precomputed echogram from sample j to sample S(i) can be denoted by $L_{i,j}(t)$. Then the energy received at the listener via propagation paths whose first reflection occurs at sample j and last reflection occurs at sample S(i) is given by:

$$E_{i,j}(t) = a^s_j a^l_i L_{i,j}(t - d^s_j - d^l_i) \tag{11}$$

and the final echogram at the listener is obtained by adding together energy received from all possible propagation paths:

$$E(t) = \sum_{i=1}^{n} \sum_{j=1}^{n} a^s_j a^l_i L_{i,j}(t - d^s_j - d^l_i) \tag{12}$$

Since the sample-to-sample echograms in the transfer operator are stored in a basis with m coefficients, we use the basis expansion to obtain:

$$L_{i,j}(t) = \sum_{k=1}^{m} \alpha^k_{i,j} b^k(t) \tag{13}$$

$$E(t) = \sum_{k=1}^{m} \left( \sum_{i=1}^{n} \sum_{j=1}^{n} a^s_j a^l_i \alpha^k_{i,j} \right) b^k(t - d^s_j - d^l_i) \tag{14}$$

where $b_k$ denotes the $k^{th}$ basis function and the α's are coefficients of echograms in the basis space. The above expression can be reformulated as a sum of convolutions:

$$E(t) = \sum_{k=1}^{m} H^k(t) \otimes b^k(t) \tag{15}$$

$$H^k(t) = \sum_{i=1}^{n} \sum_{j=1}^{n} a^s_j a^l_i \alpha^k_{i,j} \delta(t - d^s_j - d^l_i) \tag{16}$$

Therefore, at run-time, the source position can be used to quickly update $a^s_j$ and $d^s_j$, and the listener position can be used to quickly update $a^l_i$ and $d^l_i$. These can be used along with the compressed transfer operator to construct the convolution filters $H^k(t)$. Convolving the echogram basis functions with these filters and accumulating the results can yield an echogram representing higher-order reflections and diffraction from the source to the listener.

Implementation

The methods and systems discussed above can be implemented in a CPU-based system, for example by using Microsoft DirectX 9 for visualization, and Intel Math Kernel Library (MKL) for the matrix operations.

The disclosed methods and systems may allow for user-controlled approximations in one or more of the number and/or location of surface samples, frequency samples (i.e. the number of Fourier coefficients used to represent IRs), and/or number of modes retained after computing the SVD of the transfer operator.

In one implementation, for example, a surface parameterization which maps the scene primitives to the unit square can be computed (essentially a uv texture mapping). This parameterization can be computed using Least Squares Conformal Mapping (LSCM). The user can specify the texture dimensions such that each texel of the resulting texture is mapped to a single surface sample using an inverse mapping process. The number of texels mapped to a given primitive can be weighted by the area of the primitive to ensure a roughly even distribution of samples. Although the LSCM algorithm provides one option for this purpose, those having skill in the art will recognize that it can be replaced with any other technique for sampling the surfaces as long as the number of samples generated on a primitive is proportional to its area.

This exemplary implementation further allows the user to vary the number of Fourier coefficients used to represent the IRs. For example, 1K Fourier coefficients can provide an acceptable compromise between performance and quality.

Figure 3A:
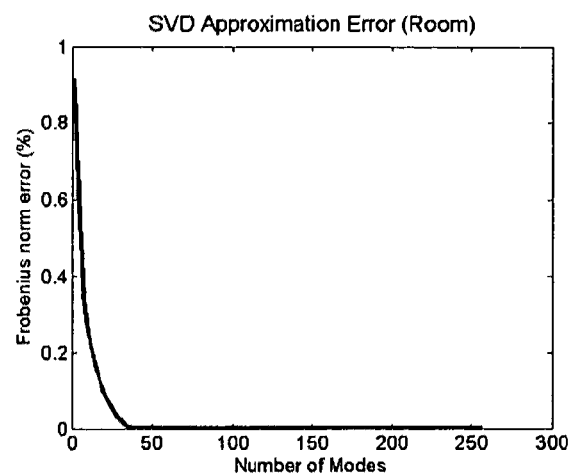
FIGS. 3a-3c are graphs illustrating SVD approximation errors for transfer operators according to three implementations of methods and systems according to embodiments of the presently disclosed subject matter.
Figure 3B:
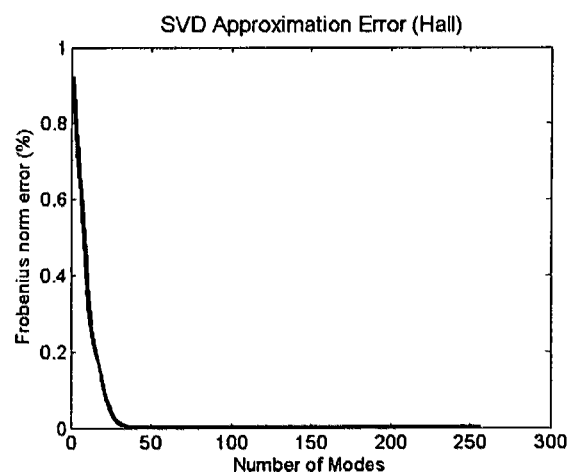
Figure 3C:
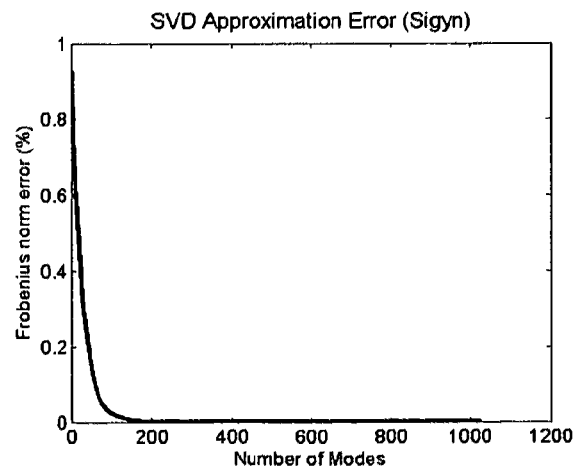
Figure 4A:
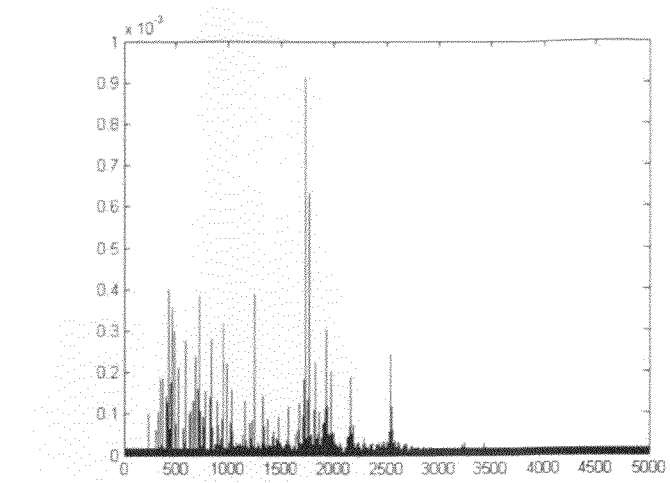
FIGS. 4a-4d are graphs illustrating comparison of second order diffuse impulse responses computed with and without SVD compression using methods and systems according to embodiments of the presently disclosed subject matter.
Figure 4B:
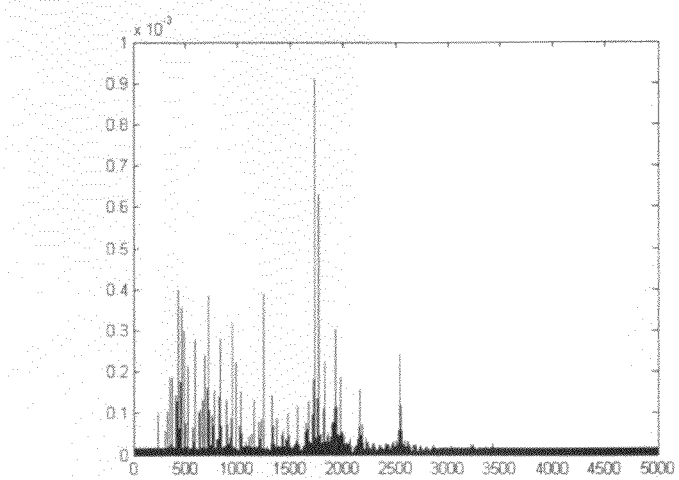
Figure 4C:
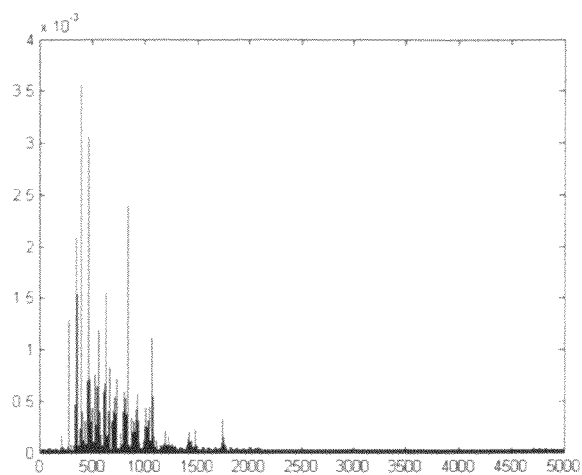
Figure 4D:
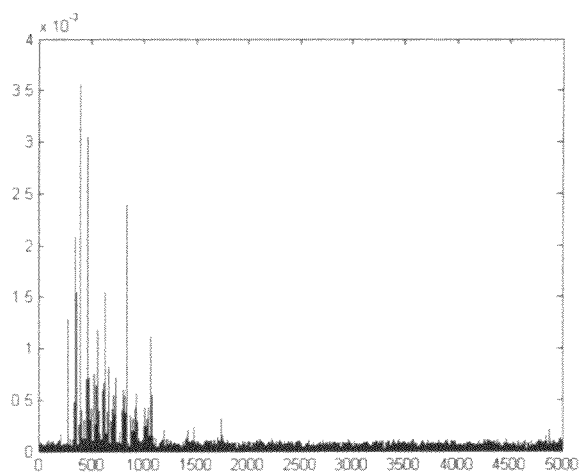

The error caused by the SVD approximation of the transfer operator can be measured in terms of the Frobenius norm. FIGS. 3a through 3c plot the Frobenius norm error against the number of modes retained for the transfer operator (T). The figure clearly shows that a very small number of modes can be used to compute IRs with diffuse reflections at runtime.

Audio Processing

As described above, the pressure signal at a source is convolved with an IR from the source to a listener to compute the final audio at the listener. The methods and systems according to the present subject matter can compute a frequency domain energy IR with 1K Fourier coefficients. The pressure IR can be computed from the energy IR and upsampled to encode the desired propagation delay in the IR.

In typical virtual environments applications, the source and listener can be moving, and the audio can be streaming from a source in chunks of audio samples (called audio frames). The size of the audio frames is determined by the allowed latency for the application. For instance, audio frames of 4800 samples at sampling rate of 48 KHz can be selected, leading to a 100 ms latency in the audio output. For a static source and listener, computing the final audio is trivial and amounts to convolving each audio frame with the IR to compute output audio frames. For moving sources and listeners, IRs evolve over time, which could lead to discontinuities in the final audio when using different IRs for two adjacent audio frames. In order to minimize such discontinuity artifacts, windowing can be applied at the source frame and the listener frame when the source and listener are moving respectively.

Experimental Results

Some experimental results on the performance and quality achieved by one implementation of the disclosed algorithm are provided below. All of these tests were performed on an Intel Xeon X5560 workstation with 4 cores (each operating at 2.80 GHz) and 4 GB of RAM running Windows Vista. MKL parallelizes our matrix operations over all 4 cores of the test machine. Therefore, the timings reported are for all 4 cores. This implementation is benchmarked on three scenes whose complexity is typical of scenes encountered in acoustics applications. Specifically, the three scenes include a room having 252 sample points, a hall having 177 samples, and an auditorium having 1024 samples (specifically, Sigyn Hall in Turku, Finland).

For comparison, a frequency acoustic radiance transfer algorithm is used. The only other algorithms for simulating diffuse reflections of sound are naive time-domain radiance transfer and path tracing. Naive time-domain radiance transfer would require a large amount of memory, and the frequency-domain radiance transfer approach is superior to it in this regard. Conversely, path tracing can be used for dynamic scenes, but the scene would have to be traversed millions of times per frame.

The frequency-domain acoustic radiance transfer method works by computing the transfer operator (without any SVD approximation) and iteratively applying it to the direct acoustic response until the solution converges. In this sense, it is similar to radiosity, and can be considered to compute the acoustic equivalent of global illumination. In order to perform a fair comparison, it is used to compute the same orders of reflection as the disclosed algorithm.

Table 1 summarizes the performance characteristics of the precomputation and runtime stages of the disclosed algorithm. The complexity of the runtime steps depends on the number of modes retained during the SVD approximation:

TABLE 1

| Scene | Precomputation Time | | Modes | Initial Scatter | Runtime Transfer Operator | Final Gather |
|---|---|---|---|---|---|---|
| | T | SVD | | | | |
| Room | 14.2 s | 94.5 s | 10 | 43.2 ms | 24.0 ms | 33.7 ms |
| | | | 25 | 45.8 ms | 43.8 ms | 35.0 ms |
| | | | 50 | 42.4 ms | 84.3 ms | 36.4 ms |
| Hall | 13.1 s | 93.1 s | 10 | 37.8 ms | 26.8 ms | 31.5 ms |
| | | | 25 | 37.1 ms | 45.5 ms | 30.2 ms |
| | | | 50 | 36.6 ms | 79.7 ms | 31.2 ms |
| Auditorium | 6.31 min | 50.9 min | 50 | 164.1 ms | 218.1 ms | 109.9 ms |

As can be seen from the table, the present algorithm allows a very efficient update of the impulse responses when the source position changes in the run-time step as compared to the state-of-the-art techniques. Note that a one-bounce transfer operator is precomputed, and the approach described is used to handle multiple orders of reflection at runtime. Depending on the application, a multi-bounce operator could also be precomputed and applied directly at runtime, thus improving performance further. However, the more flexible approach of varying the orders of reflection at runtime is used in this exemplary implementation. This way, the speedups demonstrated are lower bounds on the speedups possible (i.e., precomputing a multibounce transfer operator would result in even greater performance gains).

Table 2 shows memory requirements of the transfer operators computed by the present algorithm with ("50 Modes") and without ("Reference") SVD compression. Note that since the entries of each matrix are complex numbers, each entry requires 8 bytes of storage. All sizes in the table are in MB.

TABLE 2

| Scene | Samples | Reference | 50 Modes |
|---|---|---|---|
| Room | 177 | 250.6 | 161.6 |
| Hall | 252 | 508 | 221.6 |
| Auditorium | 1024 | 8388.6 | 839.2 |

Table 2 shows the benefit of the SVD in reducing the memory required to store the transfer operator. As can be seen, without SVD, which is essentially a form of lossy compression, the transfer operators may be too large to be used on everyday hardware. For the uncompressed ("reference") case, the transfer operator size is n×n, for each Fourier coefficient (e.g., 1K coefficients). For the compressed ("50 Modes") case, the transfer operator size is n x k for $\tilde{U}$, k×k for D and k×n for $\tilde{S}\tilde{V}^T$, where k is the number of modes retained. In the table, k=50, and n is the number of surface samples in the scene.

Table 3 compares the runtime performance of the present method to the performance of acoustic radiance transfer. Specifically, Table 3 provides a comparison of the time required by the present algorithm to update the source position and recompute the IR at the listener position after a varying number of diffuse reflections. Since the acoustic radiance transfer approach does not decouple the transfer operator from the source position, it needs to perform a costly recomputation of the transfer operator each time the source moves. By comparison, the present algorithm can quickly update the direct IR at all surface samples and can then apply the precomputed transfer operator. This allows the present approach to handle moving sources far more efficiently.

TABLE 3

| Scene | Orders | Radiance Transfer | Direct-to-Indirect Transfer (50 modes) |
|---|---|---|---|
| Room | 2 | 11.7 s | 131.8 ms |
| | 5 | 11.8 s | 154.4 ms |
| | 10 | 12.0 s | 179.3 ms |
| Hall | 2 | 10.6 s | 116.5 ms |
| | 5 | 10.7 s | 147.3 ms |
| | 10 | 10.9 s | 170.5 ms |

TABLE 3-continued

| Scene | Orders | Radiance Transfer | Direct-to-Indirect Transfer (50 modes) |
|---|---|---|---|
| Auditorium | 2 | 185.3 s | 468.5 ms |
|  | 5 | 186.7 s | 491.2 ms |
|  | 10 | 188.7 s | 512.8 ms |

FIGS. 4a through 4d show some impulse responses computed by the present algorithm, as compared with the reference acoustic radiance transfer case. As the figures show, reducing the number of modes has very little effect on the overall shape of the IRs. Coupled with the memory savings demonstrated in Table 2 and performance advantage demonstrated in Table 3, it can be seen that using the SVD allows for significant reduction in memory requirements and increased performance without significant adverse effects on the IRs computed.

Conclusion

As described above, methods and systems according to the present subject matter provide a precomputed direct-to-indirect transfer approach to solving the acoustic rendering equation in the frequency domain for diffuse reflections. The present approach is able to efficiently simulate early diffuse reflections for a moving source and listener in static scenes. In comparison with existing methods, this approach offers a significant performance advantage when handling moving sources.

The subject matter described herein for simulating sound propagation can be implemented using a non-transitory computer readable medium having stored thereon executable instructions that when executed by the processor of a computer control the computer to perform steps. Exemplary computer readable media suitable for implementing the subject matter described herein can include chip memory devices, disk memory devices, programmable logic devices, and application specific integrated circuits. In addition, a computer readable medium for implementing the subject matter described herein may be located on a single device or computing platform or may be distributed across plural devices or computing platforms.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method for simulating sound propagation within a scene, the method comprising:
pre-computing a transfer operator for simulating results of sound reflection within a modeled scene;
simulating distribution of sound energy from a sound source positioned within the scene;
applying the transfer operator to the distribution of sound energy from the sound source to compute simulated sound at a plurality of points within the scene; and
simulating collection of sound energy from the plurality of points within the scene to a listener positioned within the scene.

2. The method of claim 1, wherein pre-computing a transfer operator comprises mapping surfaces of the modeled scene to the plurality of points.

3. The method of claim 1, wherein pre-computing a transfer operator comprises forming a matrix of time-varying impulse responses at each of the plurality of points within the scene.

4. The method of claim 3, wherein forming a matrix of time-varying impulse responses comprises forming a matrix of impulse responses corresponding to a single diffuse reflection.

5. The method of claim 3, wherein forming a matrix of time-varying impulse responses comprises forming a matrix of impulse responses corresponding to multiple diffuse reflections.

6. The method of claim 3, wherein pre-computing a transfer operator comprises determining a singular value decomposition of the matrix of impulse responses.

7. The method of claim 3, wherein pre-computing a transfer operator comprises deriving a Karhunen-Loeve Transform basis matrix from the matrix of impulse responses.

8. The method of claim 1, wherein simulating distribution of sound energy from a sound source positioned within the scene comprises determining a direct impulse response to the sound source at each of the plurality of points within the scene.

9. The method of claim 8, wherein determining a direct impulse response to the sound source at each of the plurality of points within the scene comprises applying an interactive ray tracing technique to compute a direct impulse response at each of the plurality of points.

10. The method of claim 8, wherein applying the transfer operator to the simulated distribution of sound energy within the scene comprises computing an indirect impulse response at each of the plurality of points within the scene based on the direct impulse responses.

11. The method of claim 9, comprising applying the transfer operator a predetermined number of times to the simulated distribution of sound energy within the scene to compute an indirect impulse response at each of the plurality of points within the scene based on multiple reflections of the direct impulse responses.

12. The method of claim 1, wherein one or both of the sound source or the listener are moving.

13. The method of claim 1, comprising:
computing reflections and edge diffractions of the distribution of sound energy from a sound source using path tracing to simulate an early response to the distribution of sound energy;
wherein applying the transfer operator to compute simulated sound at the plurality of points comprises simulating a late response to the distribution of sound energy; and
wherein simulating collection of sound energy from the plurality of points comprises combining the early response and the late response.

14. A non-transitory computer readable medium having stored thereon executable instructions that when executed by a processor of a computer control the computer to perform steps comprising:
pre-computing a transfer operator for simulating results of sound reflection within a modeled scene;
simulating distribution of sound energy from a sound source positioned within the scene;
applying the transfer operator to the distribution of sound energy from the sound source to compute simulated sound at a plurality of points within the scene; and
simulating collection of sound energy from the plurality of points within the scene to a listener positioned within the scene.

15. The computer readable medium of claim 13, wherein pre-computing a transfer operator comprises forming a matrix of time-varying impulse responses at each of the plurality of points within the scene.

16. The computer readable medium of claim 15, wherein pre-computing a transfer operator comprises determining a singular value decomposition of the matrix of impulse responses.

17. The computer readable medium of claim 15, wherein pre-computing a transfer operator comprises deriving a Karhunen-Loeve Transform basis matrix from the matrix of impulse responses.

18. A system for simulating sound propagation within a scene, the system comprising:
 a transfer operator embodied in a non-transitory computer readable medium for simulating results of sound reflection within a scene; and
 a sound simulator for receiving as input a distribution of sound energy from a sound source positioned within a scene and for applying the transfer operator to the distribution of sound energy from the sound source to compute simulated sound at a plurality of points within the scene.

19. The system of claim 18, wherein the transfer operator comprises a matrix of time-varying impulse responses at each of the plurality of points within the scene.

20. The system of claim 18, wherein the transfer operator comprises a singular value decomposition of a matrix of time-varying impulse responses at each of the plurality of points within the scene.

21. The system of claim 18, wherein the transfer operator comprises a Karhunen-Loeve Transform basis matrix derived from a matrix of time-varying impulse responses at each of the plurality of points within the scene.

\* \* \* \* \*